(12) United States Patent
Feltner et al.

(10) Patent No.: US 6,978,541 B1
(45) Date of Patent: Dec. 27, 2005

(54) APPARATUS AND METHODS TO ENHANCE THERMAL ENERGY TRANSFER IN IC HANDLER SYSTEMS

(75) Inventors: Thomas A. Feltner, Tracy, CA (US); John C. Marley, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 237 days.

(21) Appl. No.: 10/262,998

(22) Filed: Oct. 1, 2002

(51) Int. Cl.[7] .................................. H01L 3/34
(52) U.S. Cl. .................. 29/840; 257/706; 257/707
(58) Field of Search ................ 257/700, 706–707, 257/48, 29, 361; 29/840, 740

(56) References Cited

U.S. PATENT DOCUMENTS

| 5,113,581 A | * | 5/1992 | Hidese ..................... 29/840 |
| 5,231,753 A | * | 8/1993 | Tanaka et al. ............. 29/741 |
| 5,317,803 A | * | 6/1994 | Spigarelli et al. ......... 29/840 |
| 5,582,450 A | * | 12/1996 | Nagai et al. .............. 294/64.1 |
| 2002/0116090 A1 | * | 8/2002 | Fischer ..................... 700/245 |
| 2003/0133116 A1 | * | 7/2003 | Lam et al. ................. 356/401 |

FOREIGN PATENT DOCUMENTS

JP   05191992 A   *   7/1993   ............ H02P 6/02

* cited by examiner

*Primary Examiner*—Hoai Pham
*Assistant Examiner*—Nathan W. Ha
(74) *Attorney, Agent, or Firm*—Arthur J. Behiel; LeRoy D. Maunu; Justin Liu

(57) ABSTRACT

Disclosed is apparatus to enhance thermal energy transfer from a heater to a DUT in IC handler systems. The pick-up head of an IC handler system is made of metal blocks in maximal thermal contact, and further includes an electrically resistive and thermally conductive layer. The electrically resistive layer provides ESD protection to the DUT. The preferred apparatus uses a collapsible billows suction cup to secure, pick-up, and align DUTs.

24 Claims, 3 Drawing Sheets

US 6,978,541 B1

APPARATUS AND METHODS TO ENHANCE THERMAL ENERGY TRANSFER IN IC HANDLER SYSTEMS

FIELD OF THE INVENTION

The present invention relates generally to automated test equipment for testing integrated circuits (ICs), and in particular to apparatus and methods for optimizing thermal energy transfer between self-aligning pick-up heads and DUTs in multiple-device IC handler systems.

BACKGROUND

Packaged integrated circuits (ICs) are typically tested prior to sale. Testing is typically carried out using automatic test equipment (ATE) that includes an IC test signal generator (IC tester), a test fixture (e.g., a socket) for transmitting electrical signals from the IC test signal generator to an IC device-under-test (DUT), and handler equipment that moves the DUTs between shipping, temperature-soaking, and test-fixture trays. The temperature-soaking tray is used for heating or cooling DUTs before testing. The handler also applies heat to the packaged ICs for high-temperature tests designed to identify heat-intolerant parts.

FIG. 1 depicts a handler system 100 used to move packaged IC DUTs between shipping, shuttle, temperature-soaking, and test-fixture trays collectively labeled tray 120. Handler system 100 includes an arm 110 that moves DUTs between trays. Arm 110 may be an input arm or a test arm, depending on the target trays to which the DUTs are to be moved. An input arm moves DUTs between shipping, temperature-soaking, and shuttle trays. A test arm moves DUTs between the shuttle and tester trays.

Handler system 100 includes vertically movable frames (referred to as "hands") 115, and each hand 115 supports one device pick-up head 130. Each device pick-up head 130 includes a base structure 120 held by an associated hand 115 and a movable portion 125 that transmits a vacuum pressure used to secure and pick-up a DUT during movement from one location to another. Specifically, to move DUTs between trays, arm 110 is moved horizontally and stationed over a tray, and then hands 115 are lowered until the movable portion 125 of each device pick-up head makes contact with the upper surface of the respective DUT. Next, vacuum pressure is transmitted to the device pick-up heads to secure the DUTs, and hands 115 are moved upward from the tray, thereby lifting the DUTs. Input arm 110 is then moved horizontally and stationed over the receiving tray, and hands 115 are lowered until the DUTs contact the tray. The vacuum pressure is then released, and a brief positive pressure (puff) is transmitted to each device pick-up head to release the DUTs.

FIG. 2 is a cross-sectional side view showing a simplified device pick-up head 130 similar to device pick-up heads 130 of FIG. 1. Pick-up head 130 is mounted on handler system 100 of FIG. 1 in an embodiment in which handler system 100 is adapted to test BGA-packaged DUTs.

Device pick-up head 130 includes a rigid (e.g., aluminum) base structure 210, a movable portion 220, an adjustment collar 230, and a spring 240 adapted to bias movable portion 220 away from base structure 210. Base structure 210 includes an opening 212 and a hole 214 that slidably receives movable portion 220. Base structure 210 also includes a spring mounting structure 216 adapted to hold the upper portion of spring 240. Opening 212 slidably receives movable portion 220 such that lower surface 223 of portion 220 faces away from opening 212. A shaft 224 extends upward from the base of movable portion 220 through hole 214, and a narrow connection tube 226 extends from the upper end of shaft 224. A central passage 228 extends through the base of movable portion 220, shaft 224, and connection tube 226 to transmit vacuum force from a conventional vacuum source (not shown). Applying vacuum force via central passage 228 secures BGA DUTs to lower surface 223 of base 220.

Adjustment collar 230 sets the distance from top surface 217 to lower surface 223 to a predetermined distance T to equalize distances T1, T2, and T3 (FIG. 1). Equalizing these distances ensures that during pick-up, each DUT is lifted up by the respective head. Manual adjustment of distance T for each test run increases the time required for each test.

During high-temperature tests, the DUTs are first soaked in a temperature-soaking tray until the DUTs attain a target temperature. The DUTs are then moved onto a tester tray for the high-temperature tests. A heat source (not shown) applied to top surface 217 of base structure 210 maintains the temperature of the DUTs at the target value. The applied heat is transmitted to the DUTs through air in opening 212 and the material of movable portion 220 in each pick-up head. Unfortunately, the series combination of air, movable portion 220, and the small contact area between base structure 210 and movable portion 220 forms an ineffective thermal conductor. Thus it takes a considerable time to heat the DUTs to the target temperature, and it is difficult to maintain the DUTs at the target temperature.

SUMMARY

The present invention addresses the need for test engineers to quickly and efficiently raise a packaged IC to a test temperature and to maintain the IC at the test temperature during high-temperature testing. In accordance with one embodiment, a pick-up head of an IC handler system includes one or more thermally conductive layers (e.g., aluminum) sandwiched between a thermal energy generator and a device-under test (DUT). An electrically resistive layer disposed between the thermally conductive layer and the DUT limits current passing between the DUT and the pick-up head, and therefore prevents harmful electrostatic discharge current from damaging the DUT. In one embodiment, a collapsible billows suction cup picks up the DUT and maintains the DUT in contact with the electrically resistive layer.

The claims, and not this summary, define the scope of the invention.

DETAILED DESCRIPTION

Figure 3:
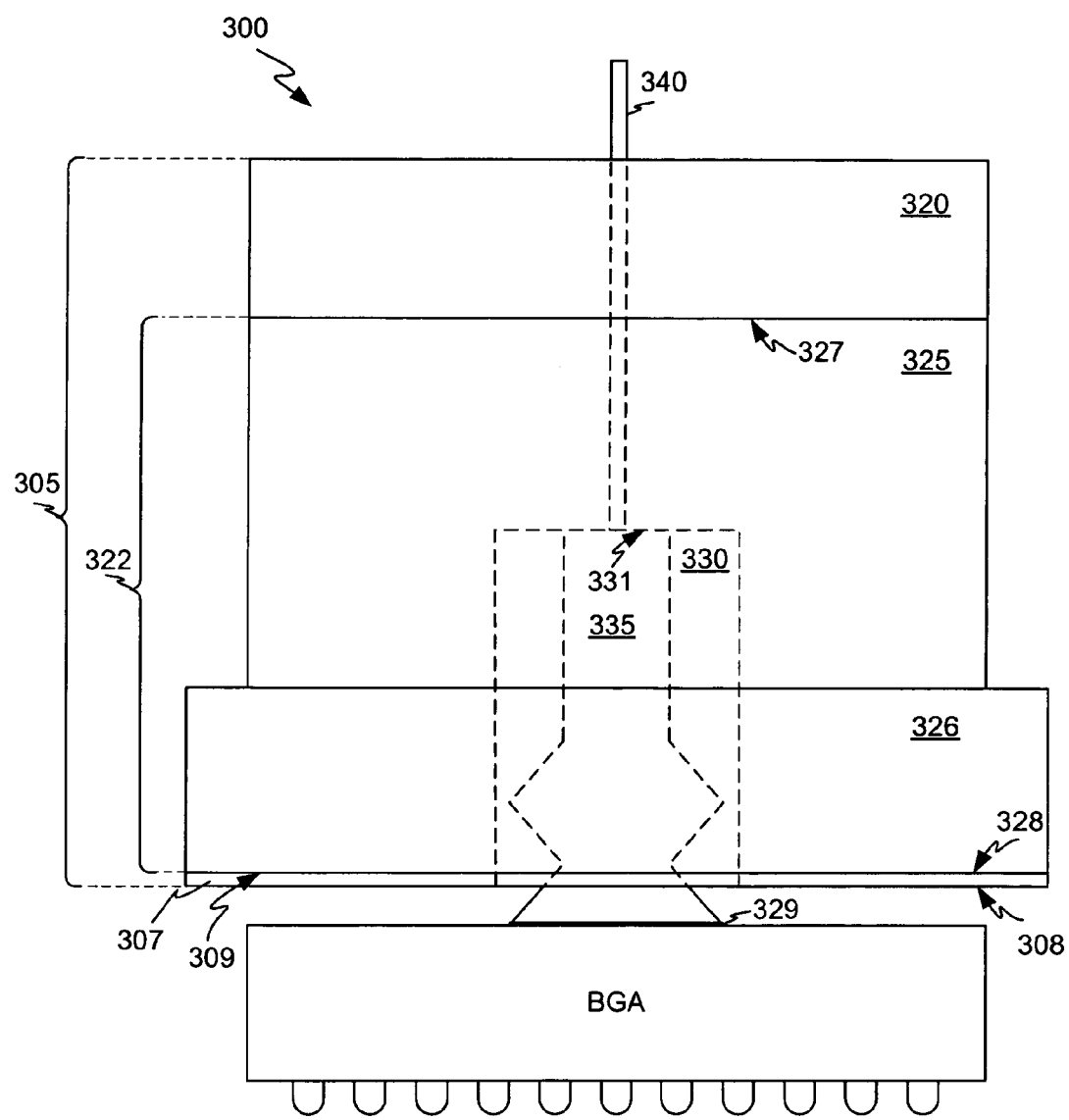
FIG. 3 is a cross-sectional side view showing an integrated circuit handler system according to an embodiment of the present invention.

FIG. 3 depicts a pick-up head 300 for an integrated circuit (IC) handler system adapted in accordance with one embodiment of the invention. AS is conventional, pick-up head 300 is used to pick up DUTs, and to thermally condition DUTs during thermal testing.

Pick-up head 300 includes a thermal energy source 305 and a collapsible billows suction cup 335. Thermal energy source 305 includes a thermal energy generator 320 (a heater), a thermally conductive layer 322, and an electrically resistive layer 307. Thermal energy generator 320 is in thermal contact with a first surface 327 of thermally conductive layer 322. In one embodiment, thermally conductive layer 322 includes two aluminum blocks, a work press 325 and a blade pack 326. In other embodiments, work press 325 and blade pack 326 are formed from a single piece of material. Thermally conductive layer 322 preferably exhibits a thermal conductivity of between 40 and 450 W/mK.

The lower surface of blade pack 326, a second surface 328 of thermally conductive layer 322, is in thermal contact with the top surface 309 of electrically resistive layer 307, a third surface of thermal energy source 305. Finally, the lower surface 308 of electrically resistive layer 307, a fourth surface of thermal energy source 305, can be in thermal contact with the upper surface of a packaged integrated circuit.

The arrangement and composition of structures 320, 325, 326, and 307 make up source 305, which is part of an efficient thermal energy transfer system that optimally conducts thermal energy between the thermal energy generator 320 and a DUT. Also, the system maximizes thermal surface contact area between work press 325 and blade pack 326, further enhancing thermal conduction.

Figure 1:
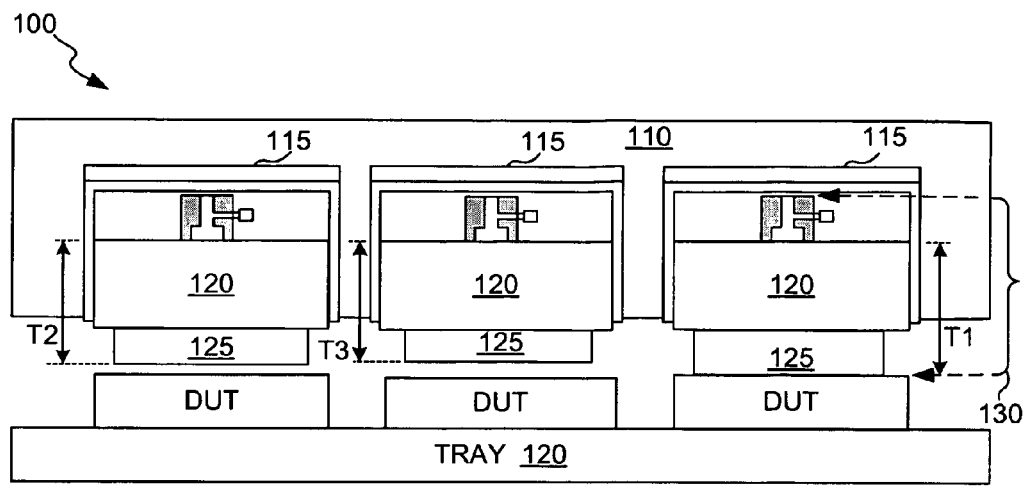
FIG. 1 (prior art) illustrates a simplified conventional ATE arrangement.
Figure 2:
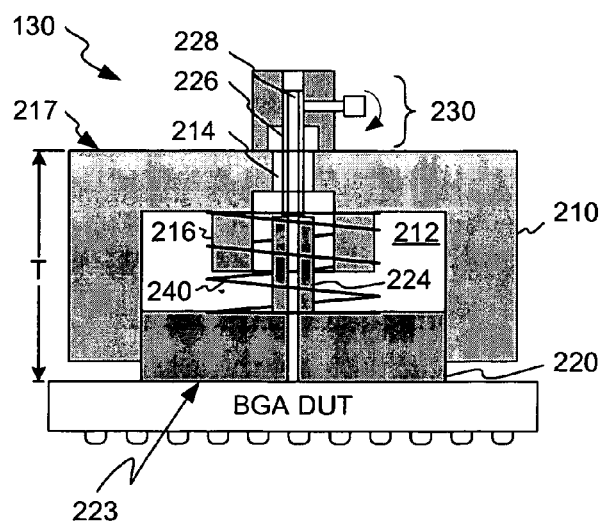
FIG. 2 (prior art) is a cross-sectional side view showing a simplified integrated circuit handler system pick-up head utilized to pick-and-place BGA-packaged ICs in the ATE arrangement shown in FIG. 1.

Thermally conductive layer 322 has an aperture 330 that extends through electrically resistive layer 307, blade pack 326, and work press 325. In the current embodiment, aperture 330 does not extend through work press 325. A retraction mechanism including a central passage 340 runs from the upper end 331 of aperture 330 to a vacuum source (not shown) through work press 325 and thermal energy generator 320. Central passage 340 transmits vacuum force to billows suction cup 335 during a pick-up operation. Billows suction cup 335 attaches to central passage 340 by a first end 331 and extends through aperture 330. A second end 329 of collapsible billows suction cup 335 protrudes from the lower side of resistive layer 307 when vacuum force is absent. The extent to which suction cup 335 protrudes is set to the same value for all the pick-up heads in handler system 100 (FIG. 1) at manufacture.

During operation, handler system 100 is lowered towards the DUTs until second end 329 of each suction cup 335 makes contact with the upper surface of the respective DUT. Second end 329 of each suction cup 335 forms a vacuum seal with the upper surface of the respective DUT when vacuum force is applied. Billows suction cups 335 retract into their respective apertures 330, and thereby secure DUTs against surfaces 308.

At full retraction, the second end 329 of suction cup 335 is coplanar with lower surface 308 of electrically resistive layer 307; hence the top surface of each DUT is in thermal contact with the respective heat source 305. Each DUT is thus automatically aligned with each head.

In one embodiment, work press 325 and blade pack 326 are aluminum, a good thermal and electrical conductor. Electrically resistive layer 307 is preferably thermally conductive and electrically resistive. In one embodiment, electrically resistive layer 307 is anodized aluminum.

In the current embodiment, anodized aluminum is the material of choice for electrically resistive layer 307 because the blade pack 326 is aluminum. During anodization of blade pack 326, aluminum and oxygen atoms combine to form an anodized aluminum layer that adheres to the aluminum surface forming an electrically resistive layer 307.

Resistive layer 307 provides excellent thermal energy conduction (coefficient of thermal conductivity of about 50 W/mK) between DUTs and thermally conductive layers 322. Equally important, resistive layer 307 slowly conducts electrostatic charge away from DUTs to prevent ESD damage. In one embodiment, resistive layer 307 exhibits an electrical resistance of between one megohm and one terohm.

Figure 4:
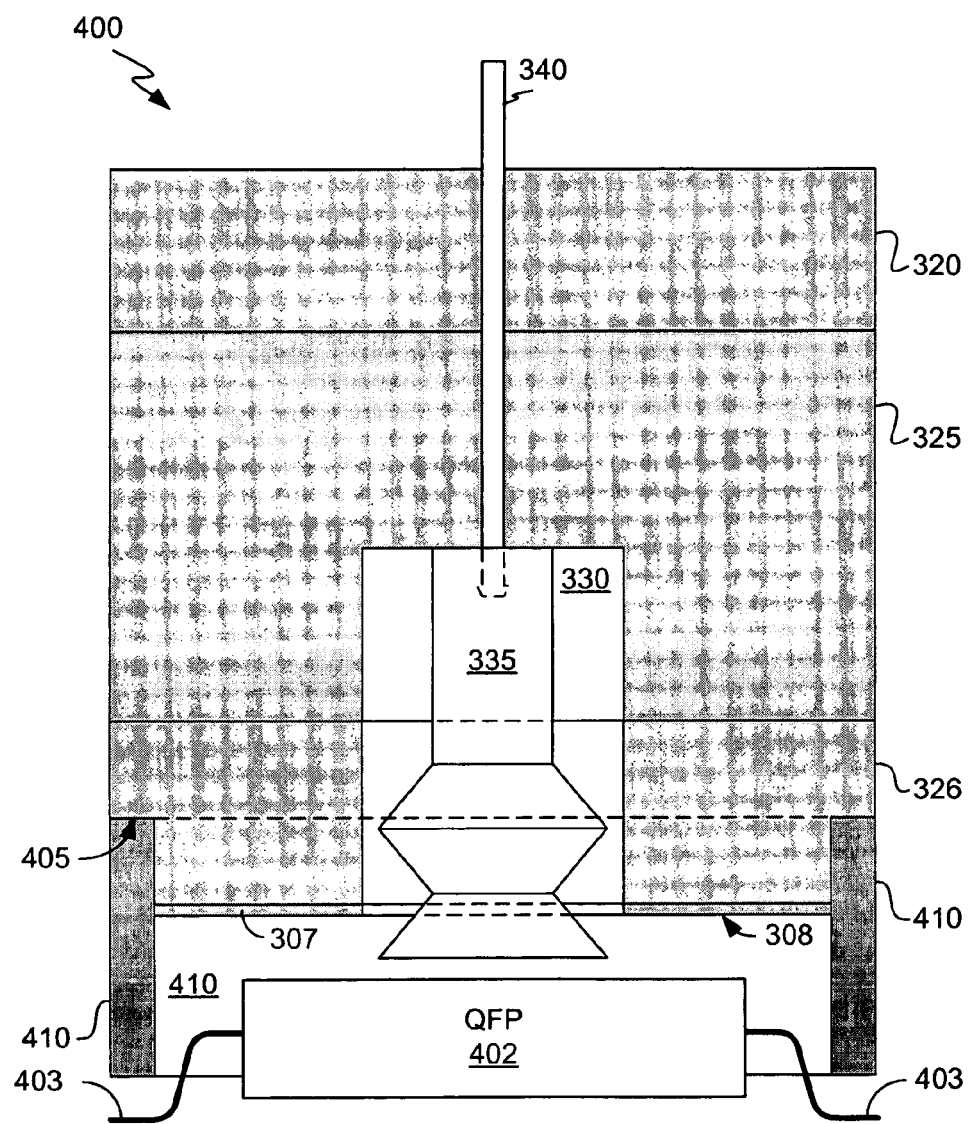
FIG. 4 depicts, in cross-section, a pick-up head 400 for a handler system adapted in accordance with an embodiment of the invention adapted for use with QFP (quad fine pitch) IC packages, one of which is shown as QFP 402.

FIG. 4 depicts, in cross-section, a pick-up head 400 for a handler system adapted in accordance with an embodiment of the invention adapted for use with QFP (quad fine pitch) IC packages, one of which is shown as QFP 402. This type of package differs from the BGA package of FIG. 3 in that leads 403 of QGP 402 extend from the sides.

Head 400 is similar to head 300 of FIG. 3, like-numbered elements being the same or similar. In this embodiment, blade pack 326 is modified to include an inverted "ledge" 405 upon which is mounted a rectangular frame 410. In operation, frame 410 presses against leads 403 to ensure contact between leads 403 and tester pins (not shown). Frame 410, formed of PEEK in one embodiment, is attached to blade pack 326 using screws (not shown) or any other appropriate connection means. (PEEK is a thermally stable thermoplastic with excellent chemical and fatigue resistance.) The height of frame 410 is selected so the lower surface 308 of electrically resistive layer 307 contacts the upper surface of QGP 402 when frame 410 contacts leads 403.

While the present invention has been described in connection with specific embodiments, variations of these embodiments will be obvious to those of ordinary skill in the art. For example, implementation of the invention is not limited to aluminum, but may be implemented using materials with appropriate thermal characteristics (e.g., steel, copper). In other embodiments, the resistive layer can be made from a material other than the material of the work press or blade pack. In such case, an intermediate layer may be required to adhere the resistive layer to the blade pack. Further, the retractable suction cup and corresponding retraction force can be of a different type, including a suction cup attached at the end of an up-down movable mechanical system. In this case, a DUT is secured by lightly pressing the suction cup on the DUT to create a vacuum seal during a downward movement; pick-up and alignment are achieved by the upward movement. Those of skill in test equipment design can adapt the present invention for use in different IC test methodologies. Therefore, the spirit and scope of the appended claims should not be limited to foregoing description.

What is claimed is:

1. A pick-up head for a packaged integrated circuit handler, wherein the packaged integrated circuit has upper and lower surfaces, the head comprising:

a thermal energy source having a heating surface in contact with the upper surface of the packaged integrated circuit, wherein the thermal energy source further includes a thermal energy generator and a thermally conductive layer disposed between the heating surface and the thermal energy generator; and a retractable suction cup with a first end connected to a retraction mechanism, and a second end forming a seal with the upper surface of the packaged integrated circuit;

wherein applying a retraction force retracts the suction cup to establish physical contact between the upper surface of the packaged integrated circuit and the heating surface.

2. The pick-up head of claim 1, wherein the retractable suction cup is a billows suction cup.

3. The pick-up head of claim 1, wherein the retraction force is a vacuum suction force.

4. The pick-up head of claim 1, wherein the heating surface includes an aperture, and wherein the suction cup extends through the aperture.

5. The pick-up head of claim 4, wherein the suction cup retracts into the aperture in response to the retraction force.

6. The pick-up head of claim 1, wherein the thermal energy source further includes an electrically resistive layer disposed between the thermally conductive layer and the package.

7. The pick-up head of claim 6, wherein the heating surface is a surface of the electrically resistive layer.

8. The pick-up head of claim 1, wherein the thermally conductive layer comprises aluminum.

9. The pick-up head of claim 6, wherein the electrically resistive layer includes oxygen and aluminum.

10. The pick-up head of claim 6, wherein the electrically resistive layer exhibits a resistance value of between about one megohms and about one terohms.

11. The pick-up head of claim 1, wherein the suction cup retracts in response to the retraction force when the second end of the suction cup is in contact with the upper surface of the package such that the second end is coplanar with the heating surface.

12. The pick-up head of claim 1, wherein the suction cup second end is coplanar with the heating surface when the suction-cup second end is in contact with the package and the retraction force is applied.

13. The pick-up head of claim 1, wherein the packaged IC includes IC leads extending in a direction substantially parallel to the heating surface, the pick-up head further comprising a frame encompassing the heating surface and contacting the IC leads.

14. A pick-up head for a packaged integrated circuit handler, the pick-up head comprising:
a thermal energy source having a heating surface, wherein the thermal energy source further includes a thermal energy generator and a thermally conductive layer disposed between the heating surface and the thermal energy generator;
a retraction mechanism connected to the thermal energy source; and
a retractable suction cup with a first end connected to the retraction mechanism and a second end extending through the heating surface, wherein applying a retraction force retracts the second end of the suction cup toward the heating surface.

15. The pick-up head of claim 14, wherein the retractable suction cup is a billows suction cup.

16. The pick-up head of claim 14, wherein the retraction force is a vacuum suction force.

17. The pick-up head of claim 14, wherein the heating surface includes an aperture, and wherein the suction cup extends through the aperture.

18. The pick-up head of claim 14, wherein the thermal energy source further includes an electrically resistive layer disposed over the thermally conductive layer.

19. The pick-up head of claim 18, wherein the electrically resistive layer exhibits a resistance value of between about one megohms and about one terohms.

20. The pick-up head of claim 18, wherein the heating surface is a surface of the electrically resistive layer.

21. The pick-up head of claim 14, wherein the thermally conductive layer comprises aluminum.

22. The pick-up head of claim 18, wherein the electrically resistive layer includes oxygen and aluminum.

23. The pick-up head of claim 14, wherein the suction cup retracts in response to the retraction force when the second end of the suction cup is in contact with an integrated circuit package such that the second end is coplanar with the heating surface.

24. The pick-up head of claim 14, wherein the packaged IC includes IC leads extending in a direction substantially parallel to the heating surface, the pick-up head further comprising a frame encompassing the heating surface and contacting the IC leads.

* * * * *